United States Patent [19]
Kimura et al.

[11] Patent Number: 5,210,479
[45] Date of Patent: May 11, 1993

[54] DRIVE CIRCUIT FOR AN INSULATED GATE TRANSISTOR HAVING OVERCURRENT DETECTING AND ADJUSTING CIRCUITS

[75] Inventors: Shin Kimura; Norikazu Tokunaga, both of Hitachi; Nobuyoshi Mutoh, Katsuta; Satoshi Ibori, Funabashi; Shuuji Musha, Hitachi; Yasuo Matsuda, Hitachi; Yutaka Suzuki, Hitachi, all of Japan

[73] Assignee: Hitachi, Ltd., Tokyo, Japan

[21] Appl. No.: 390,378

[22] Filed: Aug. 7, 1989

[30] Foreign Application Priority Data

Aug. 12, 1988 [JP] Japan ............... 63-199888
Feb. 6, 1989 [JP] Japan ............... 1-27146

[51] Int. Cl.⁵ ............... H03K 17/08; H03K 17/00; H02M 1/00
[52] U.S. Cl. ............... 318/727; 318/798; 318/138; 361/93; 361/98; 307/270
[58] Field of Search ............... 318/701–826; 307/575, 570, 577, 581, 583, 584, 270, 200 B; 361/30, 31, 23, 24, 28, 29, 57, 86–101; 363/98, 132, 41, 131, 135

[56] References Cited

U.S. PATENT DOCUMENTS

| | | | |
|---|---|---|---|
| 4,429,339 | 1/1984 | Jaeschke et al. | 361/93 |
| 4,509,089 | 4/1985 | Svedberg | 361/100 |
| 4,564,895 | 1/1986 | Glennon | 363/132 X |
| 4,580,063 | 4/1986 | Torelli et al. | 361/91 X |
| 4,581,540 | 4/1986 | Guajardo | 361/98 X |
| 4,607,171 | 8/1986 | Hellegaard | 307/270 |
| 4,672,524 | 6/1987 | Toriyama et al. | 363/98 X |
| 4,691,269 | 9/1987 | Yamane et al | 363/41 |
| 4,719,531 | 1/1988 | Okado et al. | 361/86 |
| 4,721,869 | 1/1988 | Okado | 361/89 X |
| 4,725,741 | 2/1988 | Shekhawat et al. | 307/270 X |
| 4,743,815 | 5/1988 | Gee et al. | 318/138 X |
| 4,777,579 | 10/1988 | Jahns et al. | 363/132 X |
| 4,859,921 | 8/1989 | Archer | 318/138 X |
| 4,875,000 | 10/1989 | Fry et al. | 318/798 |
| 4,890,009 | 12/1989 | Miyazaki et al. | 307/270 |

*Primary Examiner*—Paul Ip
*Attorney, Agent, or Firm*—Antonelli, Terry, Stout & Kraus

[57] ABSTRACT

An ON holding circuit is provided which outputs a signal which identifies an ON state of an insulated gate transistor to a gate voltage input circuit, and inhibits the gate voltage input circuit from being responsive to an input signal which identifies an OFF state of the insulated gate transistor when an overcurrent adjusting circuit operates continuously.

27 Claims, 9 Drawing Sheets

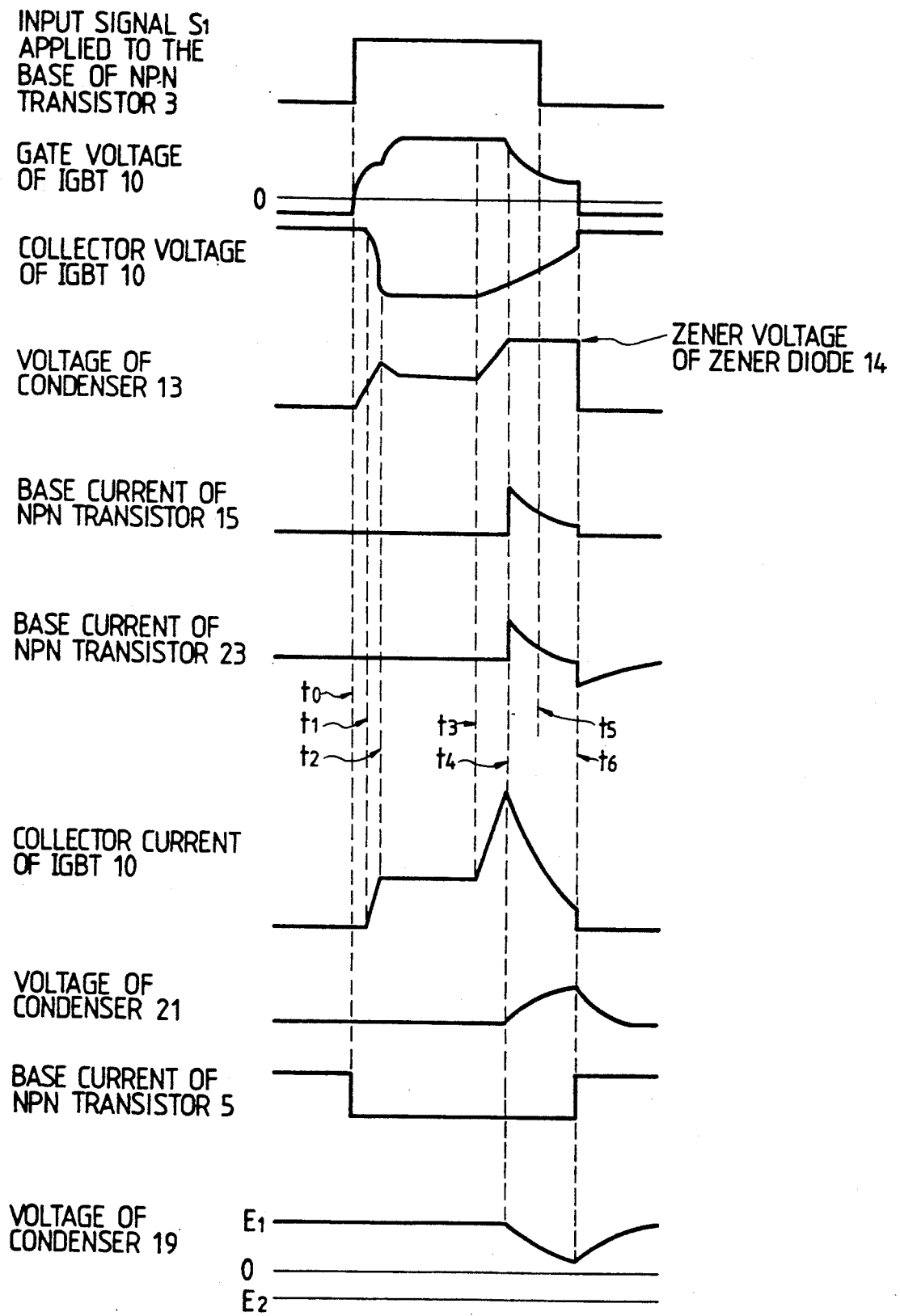

DRIVE CIRCUIT FOR AN INSULATED GATE TRANSISTOR HAVING OVERCURRENT DETECTING AND ADJUSTING CIRCUITS

FIELD OF THE INVENTION

The present invention relates to a drive circuit for an insulated gate transistor, an induction motor system having an insulated gate transistor, and an overcurrent detecting method and a circuit for an insulated gate transistor and a semiconductor device for safely carrying out when an overcurrent is passed through the insulated gate transistor.

BACKGROUND OF THE INVENTION

Many types of power switching circuit using insulated gate transistors have been proposed. There are several types of insulated gate transistors (electrostatic induction-type self-arc-suppressing elements), e.g. an insulated gate bipolar transistor (hereinafter referred to as IGBT) has an insulated gate and it is operated in a bipolar mode, and an insulated gate field effect transistor (Metal Oxide Semiconductor field effect transistor) has an insulated gate and it is operated in a field effect mode.

Because of the compactness and low-noise performance of power supplies, the insulated gate transistor which makes possible high-speed switching has been widely used in recent years. In IGBT, for example, the collector current is determined based on the gate and collector voltages as shown in FIG. 5. When the insulated gate transistors are used as the main switch of inverters for high-speed switching operations, the following problems exist: When an arm or load short-circuit of the inverter power supply occurs, the insulated gate transistors with on-state share most of the parts of power supply. As a result, by the relationship shown in FIG. 5, an extremely large short-circuit current flows. In the case of IGBT, as described in the Japanese laid-open patent application no. 61-185064, as the collector current increases greatly, these insulated gate transistors are destroyed by latch-up phenomenon originating from the out-of control gate voltage. However, in many cases, by cutting large current through high speed operations, transitional voltage greatly increases by energy from the circuit inductance at the breaking instance, thereby destroying the insulated gate transistors.

Therefore, there have been proposals for an insulated gate transistor to control the gate voltage (Japanese laid-open patent application no. 61-147736, Japanese laid-open patent application no. 61-185064, Japanese laid-open patent application no. 61-251323, Japanese laid-open patent application no. 62-277063, Japanese laid-open patent application no. 63-95722, Japanese laid-open patent application no. 63-95728, U.S. Pat. No. 4,581,540 and U.S. Pat. No. 4,721,869). These are methods which reduce the overcurrent to break it and are preferable in that the overcurrent is detected and reduced to be broken during the ON state of the insulated gate transistor.

However, in an inverter apparatus and so forth which carries out a high speed switching operation, there is a problem in that even if the overcurrent is detected, the ON state of the insulated gate transistor is finished by the input signal while reducing the overcurrent, and the insulated gate transistor is destroyed by transitional voltage, which is caused by breaking the overcurrent at the end, since the ON state of the insulated gate transistor is short.

Furthermore, these conventional methods are suitable for general application because the collector current can be reduced by suppressing the gate voltage, based on the overcurrent of the insulated gate transistor which is detected from an increase in collector voltage.

It was difficult to determine whether a short-circuit accident occurs or not unless it is determined whether the high collector to emitter voltage is caused by either overcurrent or transient phenomena, since the turn-on operation has a delay in relation to the gate voltage. Therefore, in the conventional circuits, e.g. U.S. Pat. No. 4,721,869, when an abnormality is detected by the detecting circuit, an adjusting circuit performs a dropping operation of the gate voltage of the IGBT immediately after the passage of a predetermined time following the application of the ON signal to the gate.

However, when high speed switching operations are required as in inverter apparatus, the conduction period of the insulated gate transistor for one time is short. Therefore, the predetermined time is relatively long compared with the conducting period and, eventually, the probability that the overcurrent cannot be detected increases.

SUMMARY OF THE INVENTION

The object of the present invention is to avoid the mentioned problems in the art and to provide a drive circuit for an insulated gate transistor, a switching circuit having an insulated gate transistor, an induction motor system having an insulated gate transistor, and an overcurrent detecting method and a circuit for an insulated gate transistor which are capable of high speed switching operation of the insulated gate transistor with reducing the overcurrent reliably.

Another object of the present invention is to provide an overcurrent detection method and circuit for the insulated gate transistor to detect the overcurrent on short-circuit by deciding whether overcurrent is involved when the insulated gate transistor is turning-on with a delay. Another object of the present invention is to provide a driving circuit and induction motor system for the insulated gate transistor to detect the suppress overcurrent quickly and reliably when a short-circuit occurs.

The above object is achieved according to the invention by a drive circuit for an insulated gate transistor as defined in claim 1, a switching circuit having an insulated gate transistor as defined in claim 24, an induction motor system using an insulated gate transistor as defined in claim 26, an overcurrent detection method for an insulated gate transistor as defined in claim 17, and an overcurrent detection circuit for an insulated gate transistor as defined in claim 18.

According to the present invention an ON holding circuit is provided which outputs a signal which identifies the ON state of an insulated gate transistor to a gate voltage input circuit, and inhibits the gate voltage input circuit from being responsive to the input signal which identifies the OFF state of the insulated gate transistor when the adjusting operates continuously.

According to another present invention, overcurrent detection is provided which detects overcurrent by determining whether the gate voltage of the insulated gate transistor is more than a first predetermined value and the collector voltage of the insulated gate transistor is more than a second predetermined value.

BRIEF DESCRIPTION OF THE DRAWINGS

FIG. 2 is a timing chart of the first preferred embodiment.

DETAILED DESCRIPTION OF THE PREFERRED EMBODIMENTS

Figure 1:
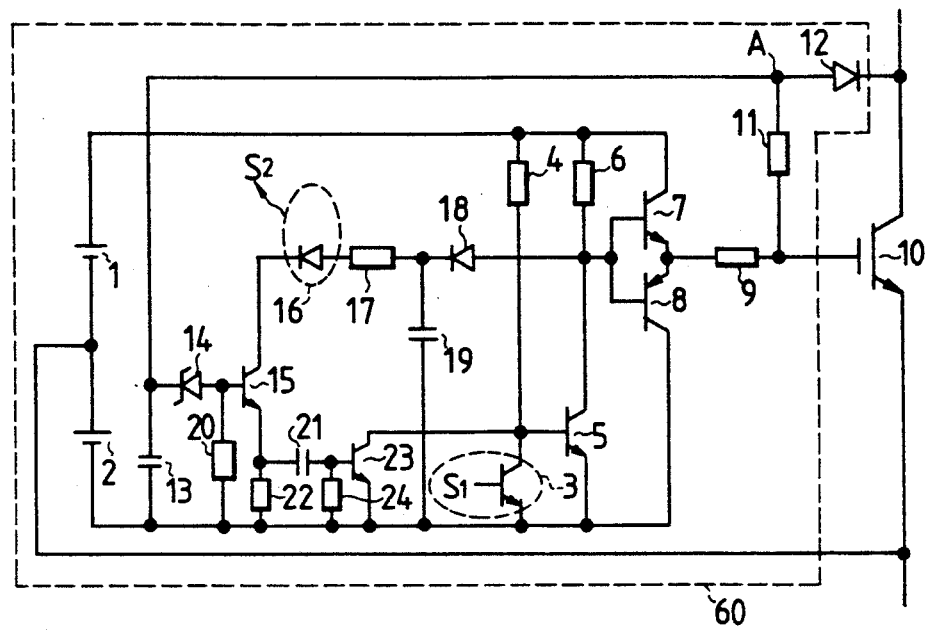
FIG. 1 is a circuit diagram of a first preferred embodiment of the present invention.

FIG. 1 is a circuit diagram of a preferred embodiment of the present invention.

In FIG. 1, IGBT 10, which is an example of the insulated gate transistor, has an insulated gate and a collector-emitter current path coupled between a main current path for switching the main current circuit. A drive circuit 60 for IGBT 10 is comprising the elements as follows. Power supplies 1 and 2, which generate constant voltage preferably, are connected in series to each other and NPN transistor 7 and PNP transistor 8. NPN transistor 7 and PNP transistor 8 are connected complementarily, their bases are commonly connected to a collector of NPN transistor 5, and their collector-emitter current paths are connected in series to each other, wherein a connection node between their collector-emitter current paths is connected to the gate of IGBT 10 through a resistor 9. A collector-emitter current path of NPN transistor 5 and a resistor 6 are connected in series between power supplies 1 and 2 wherein a connection node between NPN transistor 5 and resistor 6 is connected to the bases of NPN transistor 7 and PNP transistor 8. An NPN phototransistor 3 has a base being responsive to an input signal S1 which identifies an ON or an OFF state of IGBT 10 from a control side circuit (not illustrated in FIG. 1). A collector-emitter current path of NPN phototransistor 3 and a resistor 4 are connected in series between power supplies 1 and 2, wherein a connection node between NPN phototransistor 3 and resistor 4 is connected to a base of NPN transistor 5. The phototransistor 3, resistors 4, 6, 9, NPN transistors 5, 7 and PNP transistor 8 provide a gate voltage input circuit for converting the input signal S1 to a gate voltage, and for supplying the gate voltage to the gate of IGBT 10. The gate voltage input circuit has a similar function as the type described in the above-mentioned prior art.

An overcurrent adjusting circuit comprises an overcurrent detecting circuit and an adjusting circuit as will be discussed below.

The gate and the collector of IGBT 10 are connected to each other through a resistor 11 and a diode 12, and the connection node A of the resistor 11 and the diode 12 is connected to the base of an NPN transistor 15 through a Zener diode 14 and a condenser 13 to comprise an equivalent overcurrent detecting circuit which detects the level of the collector voltage while the gate voltage is being impressed on the gate of IGBT 10. This overcurrent detecting circuit has a similar function as the types described in Japanese laid-open patent application no. 61-147736, Japanese laid-open patent application no. 61-185064, Japanese laid-open patent application no. 61-251323, and U.S. Pat. No. 4,721,869.

Next, the collector of the NPN transistor 15 is connected to the bases of transistors 7 and 8 through a light emitting diode 16, a resistor 17 and a diode 18, and a condenser 19 is connected to the connection node of the resistor 17 and the diode 18, a resistor 20 is connected between the base of the NPN transistor 15 and the power supply 2, thus forming an adjusting circuit responsive to an output of the overcurrent detecting circuit for adjusting the overcurrent of IGBT 10 to a predetermined value in a safe operation area region of IGBT 10. In this way an overcurrent detection signal S2 is transferred from the light emitting diode 16 to the control side circuit. This adjusting circuit is, preferably, a gate voltage adjusting circuit of the type described in Japanese laid-open patent application no. 61-147736.

An ON holding circuit comprises an NPN transistor 23 having a base connected to the emitter of the NPN transistor 15 through a condenser 21 to be responsive to an output signal of the overcurrent adjusting circuit and having a collector-emitter current path connected between the base of the NPN transistor 5 and the power supply 2 in parallel with the collector-emitter current path of the NPN phototransistor 3, a resistor 22 connected between the emitter of the NPN transistor 15 and the power supply 2, and a resistor 24 connected between the base and the emitter of the NPN transistor 23.

Next, the operation of this circuit will be explained referring to the timing chart in FIG. 2.

When the NPN phototransistor 3 is in OFF state by an input signal S1 from the control side circuit, a current flows from the power supplies 1 and 2 to the base of NPN transistor 5 through the resistor 4, the NPN transistor 5 is in ON state. Then a current flows from the base of the PNP transistor 8 to the power supply 2 through the collector-emitter current path of the NPN transistor 5, so the PNP transistor is in ON state and the NPN transistor 7 is in OFF state. Therefore, a voltage between the gate and emitter of IGBT 19 (the game voltage) is negative voltage generated by the power supply 2, the IGBT 10 is in the OFF state.

When the input signal A1 identifying OFF state of IGBT 10 changes to the input signal identifying ON state of IGBT 10 at the time $t_0$, the transistor 3 turns into the ON state, the NPN transistor 5 turns into the OFF state because the base current is stopped. As a result, a current is passed from the power supplies 1 and 2 to the base of the NPN transistor 7 through the resistor 6, the NPN transistor 7 turns into ON state and a current is supplied from the power supplies 1, 2 to the gate of IGBT 10 through the NPN transistor 7 and the resistor 9. And IGBT 10 starts to turn into ON state and a current from the collector to the emitter of IGBT 10 (the collector current) begins to flow at the time $t_1$, after the capacity between the gate and the emitter of IGBT 10 is charged to a predetermined value.

During the period ($t_0$ to $t_2$), the collector voltage is higher than the gate voltage, so the condenser 13 is charged by a current through the resistor 11 as the gate voltage increases. When the gate voltage increases beyond a predetermined threshold voltage at the time $t_1$ the collector current begins to flow and the collector voltage begins to decrease. When the gate voltage is higher than the collector voltage at the time $t_2$, the current, which flowed to the condenser 13 to be charged through the resistor 11 during the period ($t_1$ to $t_2$), in transient state of IGBT 10, bypasses through the resistor 11, diode 12 and the collector-emitter current path of IGBT 10, so the condenser 13 is stopped to be charged. This normal transient current which flows to the condenser 13 during the period $t_0$ to $t_2$ is the same direction as the overcurrent of IGBT 10 which will be explained in detail later.

Therefore, the overcurrent detecting circuit includes a detection delay circuit comprising the condenser 13, the Zener diode 14 and resistor 11 in which the normal transient current flowing to the condenser 13 during the period $t_0$ to $t_2$ is not regarded and not detected as an overcurrent of IGBT 10. The zener voltage (cut-off voltage) of the Zener diode 14, resistance of the resistor 11, and capacitance of the condenser 13 are determined in the manner that in the normal turn-on operation, the voltage of the condenser 13 does not increase beyond a predetermined value provided by the zener voltage of the Zener diode 14.

In FIG. 1 and FIG. 2, the voltage of condenser 13 during the period $t_0$ to $t_2$ in the transient state of IGBT 10 is lower than the zener voltage of the Zener diode 14, so there is no current to the base of the NPN transistor 15. The NPN transistor 15 maintains the OFF state during the period $t_0$ to $t_2$, so the overcurrent detecting circuit and the adjusting circuit do not operate during the period $t_0$ to $t_2$. In other words, the overcurrent detecting circuit and the adjusting circuit are not activated by making a detection delay or by masking with the resistor 11, the condenser 13 and the Zener diode 14.

When the collector current of IGBT 10 becomes excessive as an overcurrent at the time $t_3$ in FIG. 2 or the transient current flows longer than one in the normal turn-on operation, the collector voltage of IGBT 10 is increased and is higher than the gate voltage of IGBT 10, so the condenser 13 is charged by a current through the resistor 11 and the voltage of the condenser 13 is increased.

When the voltage of the condenser 13 is increased beyond the predetermined value provided by the zener voltage of the Zener diode 14, a current to the base of the NPN transistor 15 begins to flow through the Zener diode 14 at the time $t_4$. Then the NPN transistor 15 turns into the ON state, so the adjusting circuit begins to operate.

If the transistor 15 is turned on at the time $t_4$, the charging charge of the condenser 19 starts to discharge through the resistors 17, 22 and the light emitting diode 16. The voltage of the condenser 19, the base voltage of the transistor and the gate voltage of IGBT 10 decrease toward the final gate voltage determined by the ratio of resistor 6, the resistor 17 and the resistor 22. However, they are not lowered to the overcurrent detection voltage determined by the zener voltage of the Zener diode 14, because if the gate voltage of IGBT 10 decreases to the zener voltage of Zener diode 14, the current from the gate of IGBT 10 to the base of the NPN transistor 15 through the resistor 11 is blocked by the Zener diode 14. So, the gate voltage of IGBT 10 decreases toward the predetermined value.

For a more detailed description of the function of the overcurrent detecting circuit, the detection delay circuit and the adjusting circuit, reference may be made to the above-mentioned Japanese laid-open patent application no. 61-147736, Japanese laid-open patent application no. 61-185064, Japanese laid-open patent application no. 61-251323 and U.S. Pat. No. 4,721,869.

Next the ON holding circuit is provided with a circuit for outputting a signal which identifies the ON state of IGBT 10 to the base of the NPN transistor 5 in the gate voltage input circuit and for inhibiting the base of the NPN transistor 5 from being responsive to the input signal S1 which identifies the OFF state of the IGBT 10 through the NPN transistor 3 when the adjusting circuit continuously, ($t_4$ to $t_6$).

When the NPN transistor 15 in the overcurrent detecting circuit is turned into the ON state at the time $t_4$, a current flows from the condenser 19 to the base of the NPN transistor 23 through the condenser 21, then the ON holding circuit is activated because the NPN transistor 23 is turned into the ON state. Therefore, during the period $t_4$ to $t_5$, the base of the NPN transistor 3 is responsive to the input signal S1 which identifies the ON state of IGBT 10 and the base of the NPN transistor 23 is responsive to the signal form from the condenser 19 which identifies the ON state of IGBT 10, both NPN transistor 3 and NPN transistor 23 are in the ON state. So the NPN transistor 5 maintains the OFF state, then IGBT 10 maintains the ON state.

When the input signal S1 from the control side identifying the ON state of IGBT 10 changes to the input signal identifying the OFF state of IGBT 10 at the time $t_5$, the NPN transistor 3 turns into the OFF state. However the NPN transistor 23 maintains the ON state because the current from the condenser 19 to the base of the NPN transistor 23 remains. The base current of the NPN transistor 5 remains to be stopped because a current from power supplies 1 and 2 through resistor 4 bypasses through the collector-emitter current path of the NPN transistor 23. Therefore during the period $t_5$ to $t_6$, the NPN transistor 5 maintains the OFF state, then IGBT 10 maintains the ON state even if the input signal S1 identifies the OFF state of IGBT 10, so the adjusting circuit remains to operate to decrease the gate voltage of IGBT 10 toward the predetermined value in the safe operation area region of IGBT 10 in order to reduce the overcurrent. During period $t_4$ to $t_6$, the condenser 19 discharges and the condenser 21 charges. When the voltage of condenser 19 is nearly equal to the voltage of resistor 22 at the time $t_6$, the base current of the NPN transistor 23 is stopped, the NPN transistor 23 turns into the OFF state. Then the NPN transistor 5 turns into the ON state because the base current of the NPN transistor 5 flows through the resistor 4. Therefore IGBT 10 turns into the OFF state. When IGBT 10 turns into the OFF state at the time $t_6$, the condenser 21 starts to be discharged through the resistor 22 and the condenser 19 starts to be charged through the resistor 6.

During the period $t_4$ to $t_6$ when the adjusting circuit operates continuously, the NPN transistor 23 outputs the signal which identifies the ON state of IGBT 10 to the base of the NPN transistor 5 and the base of the NPN transistor 5 is inhibited from being responsive to the input signal S1 which identifies the OFF state of IGBT 10. In other words, the gate voltage input circuit (for instance, the NPN transistor 5) is responsive to a logical OR of the output signal of the ON holding circuit (for instance, the NPN transistor 23) and the input signal S1 (for instance, through the NPN transistor 3).

In the present invention, as mentioned above, the overcurrent of IGBT 10 can be stopped all the time at the time $t_6$ after it is slowly reduced to a predetermined value in the safe operation area region of IGBT 10, even if the input signal S1 changes to one identifying the OFF state of IGBT 10 while reducing the overcurrent. Therefore, generation of a transitional voltage caused by breaking the overcurrent when IGBT 10 turns into the OFF state and destruction of the IGBT 10 can be prevented.

A characteristic of this preferred embodiment is that it is provided with a circuit for holding an ON state of IGBT 10 even if the input signal which identifies the OFF state of IGBT 10 is received from the control side at the time $t_5$, that is, for keeping adjusting the gate voltage of IGBT 10 until the gate voltage of IGBT 10 is lowered to a predetermined value ($t_6$).

Figure 3:
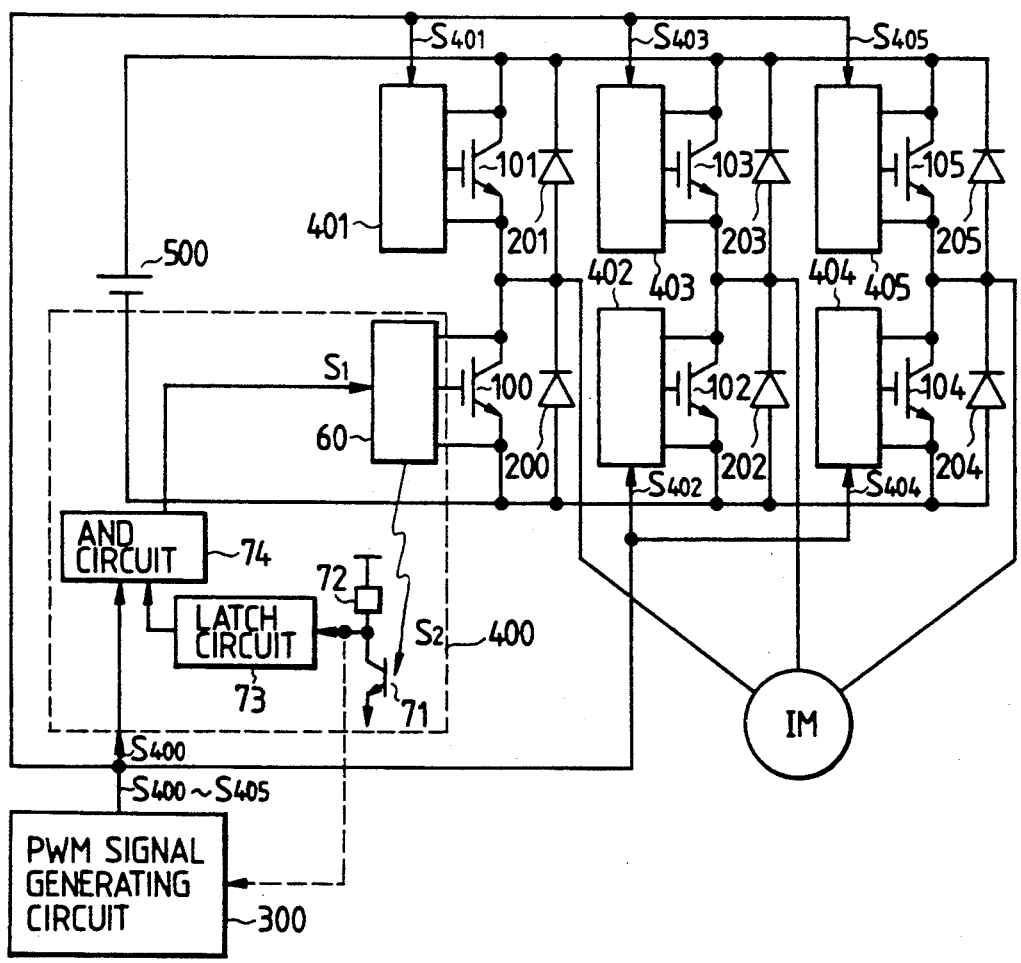
FIG. 3 is a circuit diagram of an embodiment of a three-phase voltage inverter device.

FIG. 3 shows a circuit diagram of an embodiment of a three-phase voltage-type induction motor system as one example of a current switching apparatus. The three-phase invertar is constituted so that three arms wherein one arm is comprising a pair of IGBT switches wherein collector-emitter current paths are connected in series (100+101, 102+103, 104+105) and diode connected in parallel with each of IGBT switches 200, (201, 202, 203, 204, 205) and, are connected in parallel with the three-phase direct current power source 500, and an induction motor IM, which is a load, is connected to a switch connection node of each arm of phase. Each of IGBT 100, 101, 102, 103, 104 and 105 are provided with a circuit 400, 401, 402, 403, 404 and 405. Each of the circuits 400, 401, 402, 403, 404 and 405 are provided with the drive circuit 60 shown in the first preferred embodiment or in one of the later mentioned second to seventh preferred embodiments, a NPN phototransistor 71 responsive to the overcurrent detection signal S2 from the light emitting diode 16 wherein a photocoupler comprises the light emitting diode 16 and the NPN phototransistor 71, and a resistor 72, a latch circuit 73 and an AND circuit 74 which outputs AND of the output of the latch circuit and a PWM (Pulse Width Modulation) signal S400 generated in a PWM signal generating circuit 300. For a detailed description of the operations of the NPN phototransistor 71, the resistor 72, the latch circuit 73 and the AND circuit 74, reference may be made to the above-mentioned Japanese laid-open patent application no. 61-251323 and U.S. Pat. No. 4,721,869. And the control side circuit in the first preferred embodiment or in one of the later mentioned second to seventh preferred embodiments comprises the NPN photo transistor 71, the resistor 72, the latch circuit 73, and AND circuit 74 and the PWM signal generating circuit 300.

In FIG. 3, a detailed circuit diagram of each of the circuits 401, 402, 403, 404 and 405 is not illustrated because it is the same as the circuit 400.

Figure 4A:
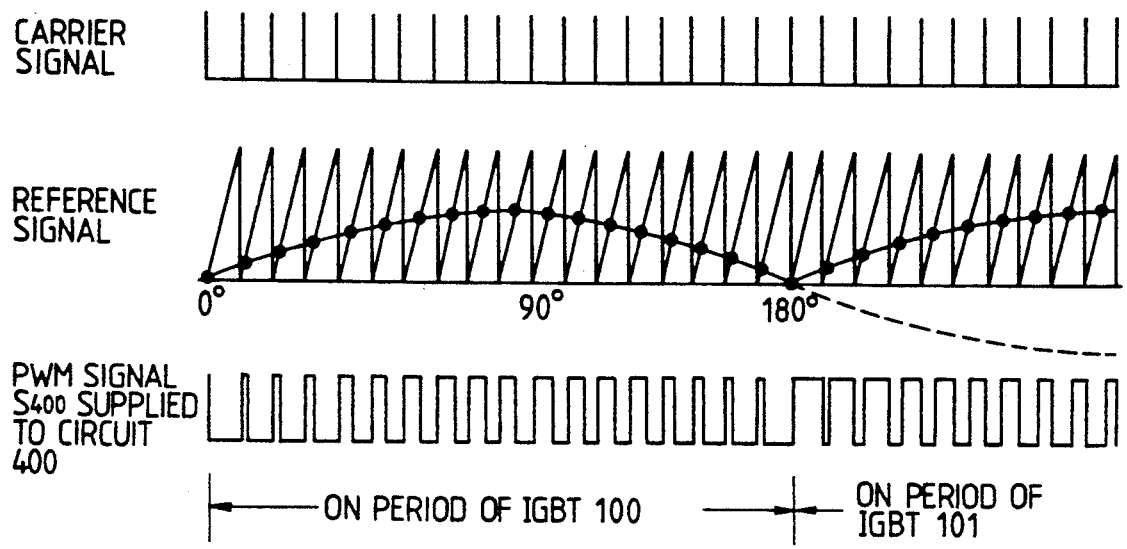
FIG. 4(A) is a timing charge of the PWM signal.

FIG. 4(A) shows the well-known timing chart of the PWM signal generating circuit 300.

The PWM signal generating circuit 300, for example, comprising a microprocessor, generates the PWM signals S400, S401, S402, S403, S404 and S405 from a reference signal which compares the triangle wave produced from a carrier signal and a sine wave. In FIG. 4(A) the period 0° to 180° is the ON period of IGBT 100, and the period 180° to 360° is the ON period of IGBT 101. During the ON period of IGBT 100 (0° to 180°), the PWM signal S401, is the logical invert signal of the PWM signal S400 shown in FIG. 4(A). During the ON period of IGBT 101 (180° to 360°), the PWM signal S401 is the same signal as the PWM signal S400 during the ON period of IGBT 100 (0° to 180°), and the PWM signal S400 during the ON period of IGBT 101 (180° to 360°) shown in FIG. 4(A) is the logical invert signal of S401 during the ON period of IGBT 101 (180° to 360°).

Figure 4B:
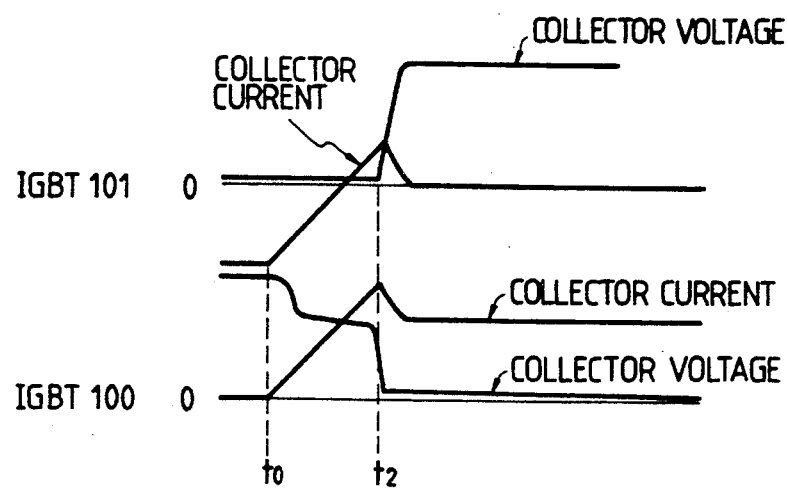
FIG. 4(B) is a timing chart of IGBT 100 and IGBT in FIG. 3.

FIG. 4(B) shows the timing chart of IGBT 100 and IGBT 101 during the period $t_0$ to $t_2$ when IGBT 100 turns from the OFF state to the ON state in the transient state.

During the period $t_0$ to $t_2$, there is a commutation mode wherein a commutation current flows to diode 201 in the upper arm, so the collector voltage of IGBT 100 is not decreased rapidly as shown in FIG. 4(B). Then the collector voltage of IGBT 100 is higher than the gate voltage of IGBT 100, so then the normal transient current, which should not be regarded or should not be detected as an overcurrent flows to the condenser 13 in FIG. 1.

When the IGBT 100 is in the ON state, and the arm short-circuit wherein the IGBT 101 turns into the ON state by accident and/or the load short-circuit wherein the load such as the induction generator IM is short by accident, occurs, the collector voltage increases. Then the current which should be regarded or should be detected as an overcurrent flows to the condenser 13 in FIG. 1.

The above example applies to the inverter. However, this invention can be applied for the insulated gate transistor of current control devices, including chopper circuits to obtain the same effects.

Figure 6:
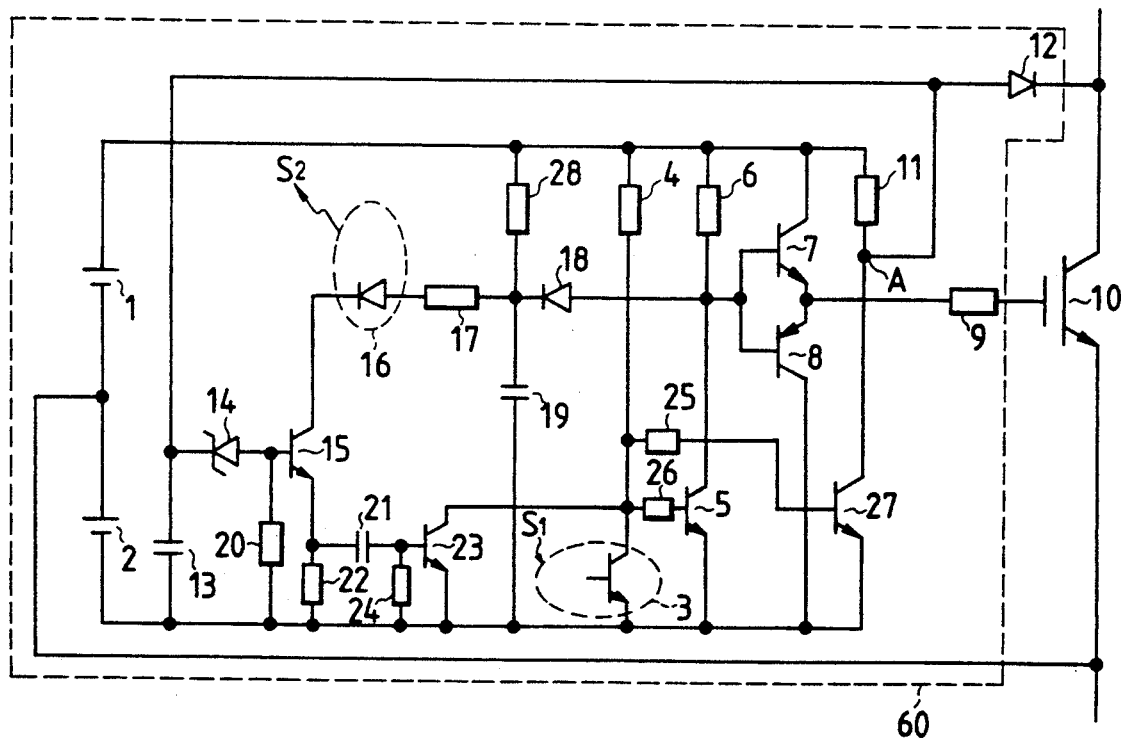
FIG. 6 is a circuit diagram of a second preferred embodiment.

FIG. 6 is a circuit diagram showing the second preferred embodiment of the present invention. The same designating numbers are set for those with the same function in FIG. 1. The overcurrent detection circuit and overcurrent detection method are different from those in FIG. 1.

In FIG. 6, the connection node of the collector-emitter current path of the NPN transistor 3 and the resistor 4 is connected to the base of the NPN transistor 5 through a resistor 26 and the base of an-NPN transistor 27 through a resistor 25. A collector-emitter current path of NPN transistor 27 and the resistor 11 are connected in series between power supplies 1 and 2, wherein the connection node A is connected to the base of the NPN transistor 15 through the Zener diode 14. A resistor 28 for charging the condenser 19 and the condenser 19 are connected in series between power supplies 1 and 2.

The voltage of the connection node A is changing at the substantially same as the gate voltage of IGBT 10. So the overcurrent detection voltage (a first predetermined voltage) is determined by the function of the zener voltage of the Zener diode 14' and the final gate voltage of IGBT (a second predetermined voltage) is determined by the ratio of the resistor 6, the resistor 17 and the resistor 22 independently. In other words, in the first embodiment in FIG. 1, the final gate voltage cannot be reduced below the overcurrent detection voltage as mentioned above, however in this second embodiment in FIG. 6, the overcurrent detection voltage can be different from the final gate voltage of IGBT 10. Preferably the overcurrent detection voltage can be larger than the final gate voltage of IGBT 10 in order to prevent the overcurrent detection circuit from misoperating and to reduce the gate voltage of IGBT 10 lower.

In this second preferred embodiment, it has a characteristic in that the overcurrent detection voltage and the final gate voltage can be selected separately.

The resistor 28 is separated from the resistor 6. A charging current to the condenser 19 flows through the resistor 28 and the base current of the NPN transistor 7 flows through the resistor 6 independently. Therefore charging condenser 19 in FIG. 6 is quicker than one in FIG. 1.

Figure 7:
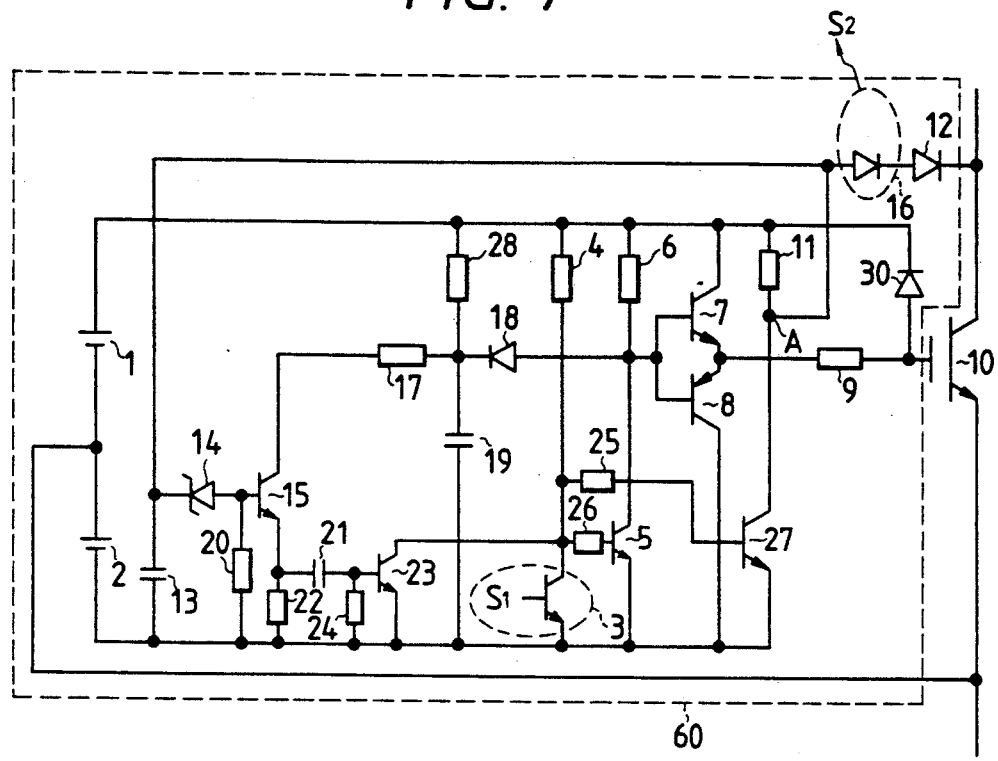
FIG. 7 is a circuit diagram of a third preferred embodiment.

FIG. 7 is a circuit diagram showing the third preferred embodiment of the present invention. It is different from the second embodiment in FIG. 6 in that a diode 30 is connected between the gate and the positive electrode of the gate power source 1, and in that the light emitting diode 16 is connected between the diode 12 and the connection node A.

The diode 30 has the function of clamping the maximum value of the gate voltage of IGBT 10 during the ON state period on the voltage of power source, as described in the above-mentioned Japanese laid-open patent application no. 63-95728. The light emitting diode 16 outputs signal S2 during $t_0$ to $t_1$ (IGBT 10 turn-on-delay) period and during $t_4$ to $t_6$ in FIG. 2. Control side circuit in FIG. 3 is responsive to the signal S2, shown as dotted line in FIG. 3 and the PWM signal generating circuit outputs the PWM signal S400 to S405 based on IGBT turn-on-delay period $t_0$ to $t_1$. Therefore, the control side circuit can grasp the correct turn-on period of IGBT ($t_1$ to $t_6$) and control performance can be improved.

Figure 8:
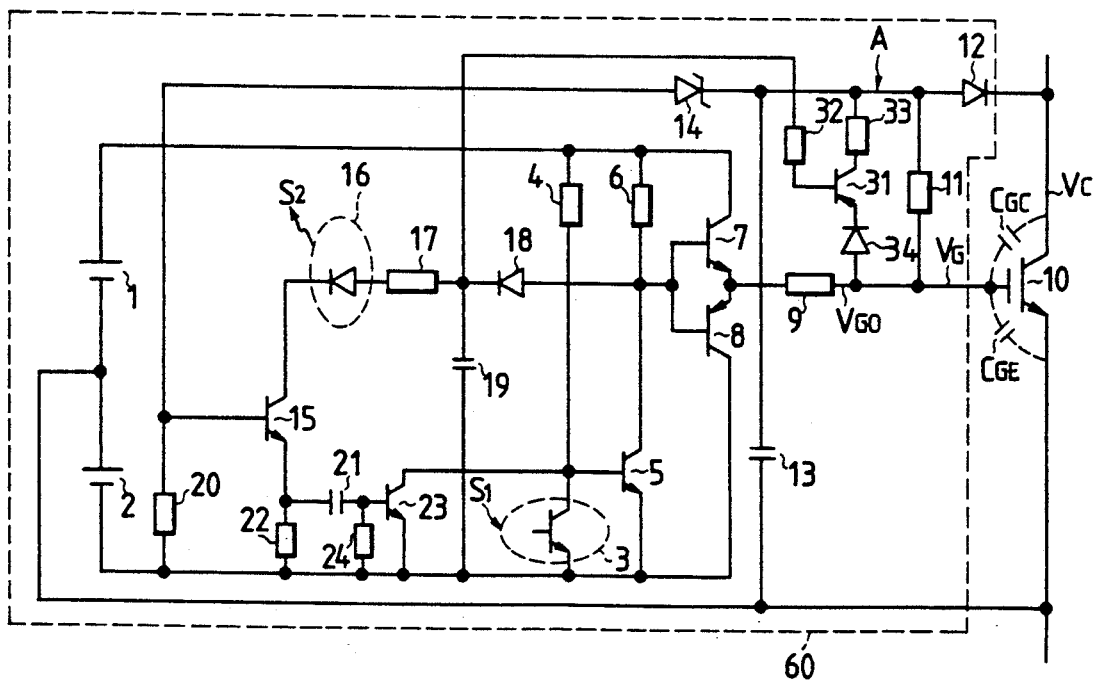
FIG. 8 is a circuit diagram of a fourth preferred embodiment.

FIG. 8 is a circuit diagram showing the fourth preferred embodiment of the present invention. It is different from the first embodiment in FIG. 1 in that a second overcurrent detecting circuit comprises a PNP transistor 31 having a base connected to the condenser 19 through a resistor 32, and a resistor 33 and a diode 34. A collector-emitter current path of the PNP transistor 31, the resistor 33 and the diode 34 are connected in series between the gate of IGBT 10 and the connection node A. And the condenser 13 is connected to the connection node A and the power supply 2 for the substantially same function as one in the first embodiment in FIG. 1.

In other words, the gate voltage Vg of IGBT 10 is supplied to the emitter of the PNP transistor 31 through the diode 34 having a forward drop voltage $V_{DF}$ and the voltage of the capacitor 19 as the predetermined reference value $V_{gs}$ is supplied to the base of the PNP transistor 31 through the resistor 32. In the case of $Vg - V_{DF} > V_{gs}$, ($Vg > Vgs + V_{DF}$), the PNP transistor 31 turns into the ON state, the voltage (Vg31 $V_{DF}$), which is based on the gate voltage Vg, is output as a second overcurrent detection signal through the resistor 33. This output node is connected to the connection node A of the first overcurrent detecting circuit comprising the resistor 11 and the diode 12. In this way, the connection point A outputs a logical AND of the first and second overcurrent detection signals.

Figure 9:
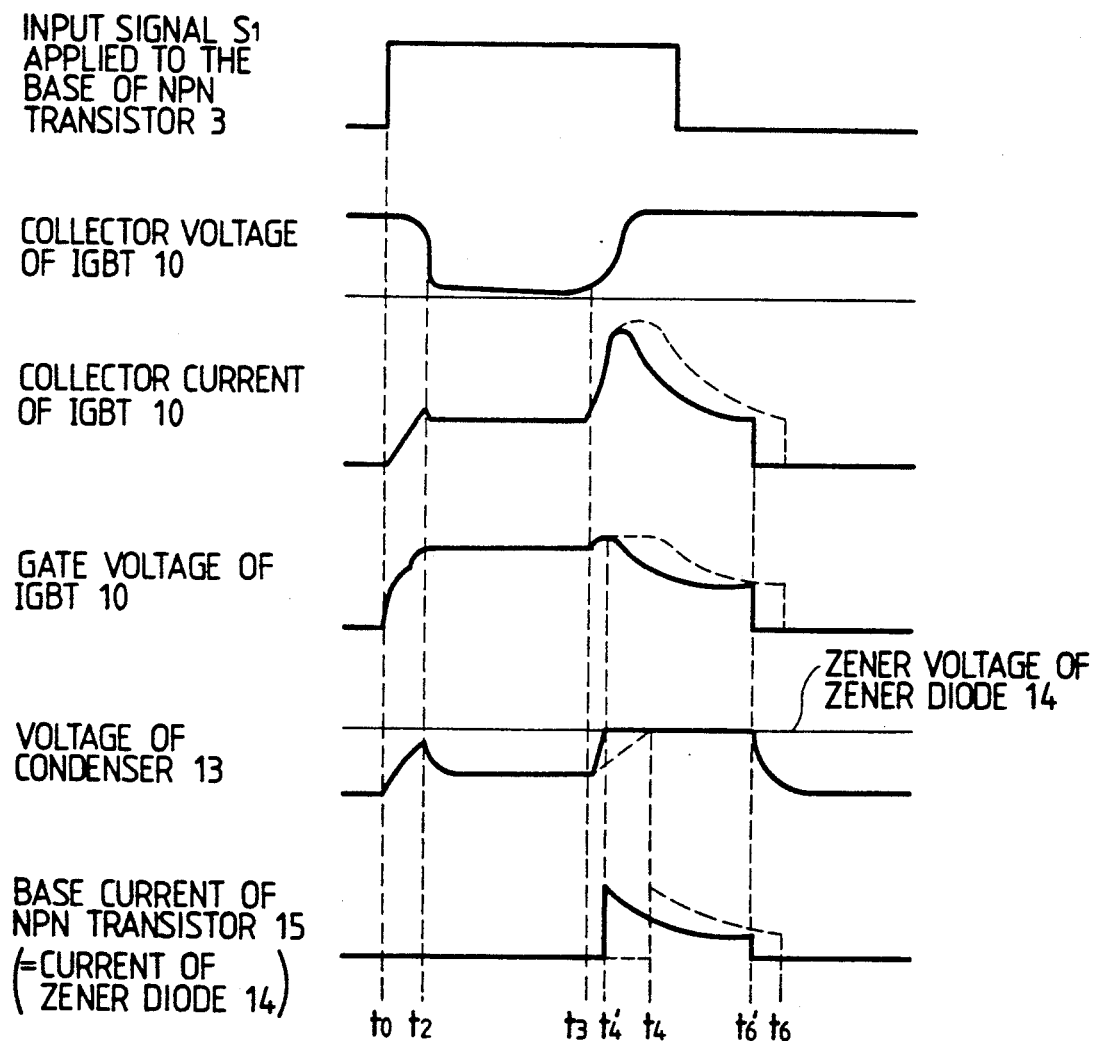
FIG. 9 is a timing chart of the fourth embodiment.

The operations of the second overcurrent detecting circuit in the fourth embodiment in FIG. 8 are explained by the timing chart in FIG. 9.

Figure 5:
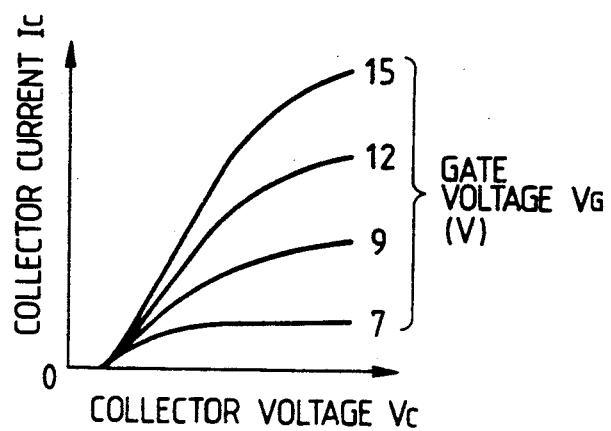
FIG. 5 is a characteristic chart of collector voltage, collector current and gate voltage of IGBT.

Since the collector voltage Ve of the IGBT during the normal transient condition from the OFF state to the ON state ($t_0$ to $t_2$) decreases until the level is equivalent to the forward direction voltage drop from the main circuit power supply, the gate voltage Vg tends to decrease through the feedback capacitor Cgc, and is smaller than the output voltage Vgo of the gate voltage input circuit. Therefore, the PNP transistor 31 is maintained in the OFF state and the second overcurrent signal from this second overcurrent detecting circuit is not output to the connection node A. Conversely, at the time $t_3$, in FIG. 9, overcurrent caused by the arm short-circuit and/or the load short circuit flows, the collector voltage of the IGBT 10 starts to increase by the relationship in FIG. 5, and the emitter current from the gate flows through the feedback capacitor Cgc. As a result, the gate voltage Vg of IGBT 10 increase is higher than Vgo and the PNP transistor 31 turns into the ON state. Here, Vgo in FIG. 8 is the voltage of the capacitor 19. When the PNP transistor 31 turns on, the gate voltage Vg is output as the second overcurrent detection signal through the resistor 33. When the voltage of the condenser 13 is increased beyond the predetermined value provided by the zener voltage of the Zener diode 14 at the time $t_4'$; then the NPN transistor 15 turns into the ON state, and the adjusting circuit begins to operate, as mentioned in the first embodiment. Due to this operation, the condenser 13 is charged in parallel to the first overcurrent detecting circuit as described previously in the first embodiment and the second overcurrent detecting circuit, the period ($t_3 - t_4'$) is reduced because the time constant for charging increases, eventually, as shown in FIG. 9. Therefore, the IGBT 10 turns into the OFF state at the time $t_6'$, quickly. In FIG. 9, the signals illustrated by the dotted lines show the timing of the first embodiment in FIG. 1, which includes only the first overcurrent detecting circuit but does not include the second overcurrent detecting circuit. Here, by selecting a small value for the resistor 33 compared with resistor 11, the period $t_3 - t_4'$ can be largely reduced. Also when the PNP transistor 31 turns on because of misoperation, by increasing the gate voltage Vg due to the noise, the overcurrent detection signal is not output because the voltage at the node A is pulled down by the collector voltage Vc, which is lower than the gate voltage, under an on-state of IGBT. In other words, the current, which is flowed through the resistor 33, bypassed to the collector-emitter current path of IGBT 10, through the diode 12.

As is understood by the foregoing explanation, since the second overcurrent detecting circuit gate on the base voltage does not operate during normal transient condition ($t_0$-$t_2$), the first overcurrent detecting circuit shown in FIG. 8 and the detection delay circuit as mentioned above can be omitted, wherein the overcurrent of the IGBT 10 can be also quickly detected. In this case, preferably, to avoid misoperations caused by noise, installation of the diode circuit 12 is desired. Also, in the case of overcurrent by the load short-circuit, there might be problems wherein the raising ratio of the collector voltage Vc is suppressed due to line inductance, and the gate voltage is delayed or does not attain the reference value required for decision making. Here, by combining the first overcurrent detecting circuit based on the collector voltage of IGBT 10 and the second overcurrent detecting circuit based on the gate voltage of IGBT 10 as shown in FIG. 8 overcurrent can be reliably detected.

Figure 10:
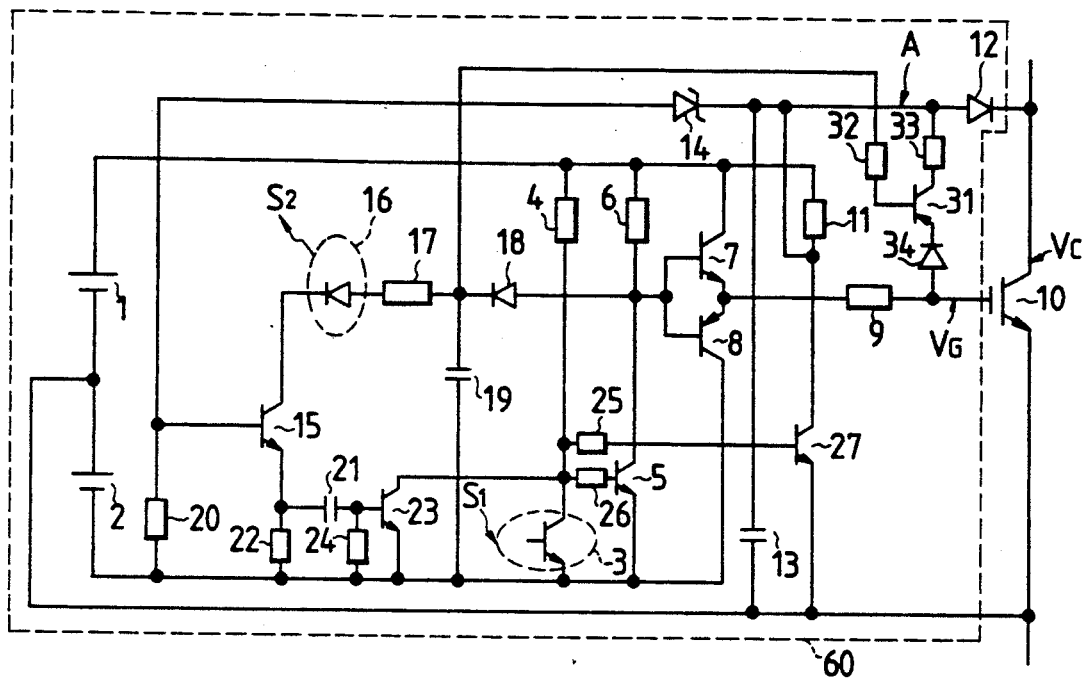
FIG. 10 is a circuit diagram of a fifth preferred embodiment.

FIG. 10 shows the fifth preferred embodiment in which this invention is applied. The same symbols for the same functions as the above-mentioned embodiments are used in FIG. 10 for simplicity. This fifth embodiment comprises the combination of the second embodiment in FIG. 6 and the fourth embodiment in FIG. 8.

Figure 11:
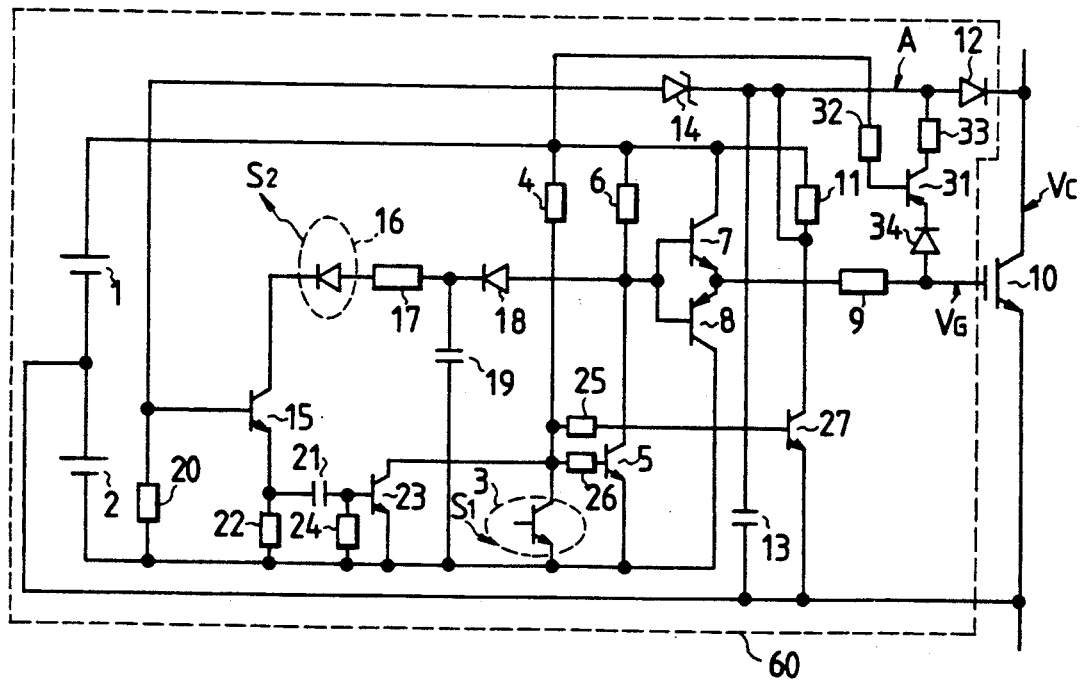
FIG. 11 is a circuit diagram of a sixth preferred embodiment.

FIG. 11 shows the sixth preferred embodiment in which this invention is applied. The difference between FIG. 10 and FIG. 11 is the connection point of the resistor 32 connected to the base of the PNP transistor 31 for gate voltage detection, and in FIG. 11 the resistor 32, is connected to the power supply 1. In case of the insulated gate transistor such as IGBT, MOS-FET, the characteristics between the emitter and the gate, are equivalent to those of a capacitor, the potential at its gate terminal increases until the power supply level is under the ON state, so that the timing for gate voltage detection itself is unchanged. However, when the adjusting circuit is operated and the gate voltage is suppressed, the operation of the second overcurrent detecting circuit due to the gate voltage is stopped. At this time, since the first overcurrent detection circuit has already operated, the operation of the overcurrent suppressing is unaffected.

Figure 12:
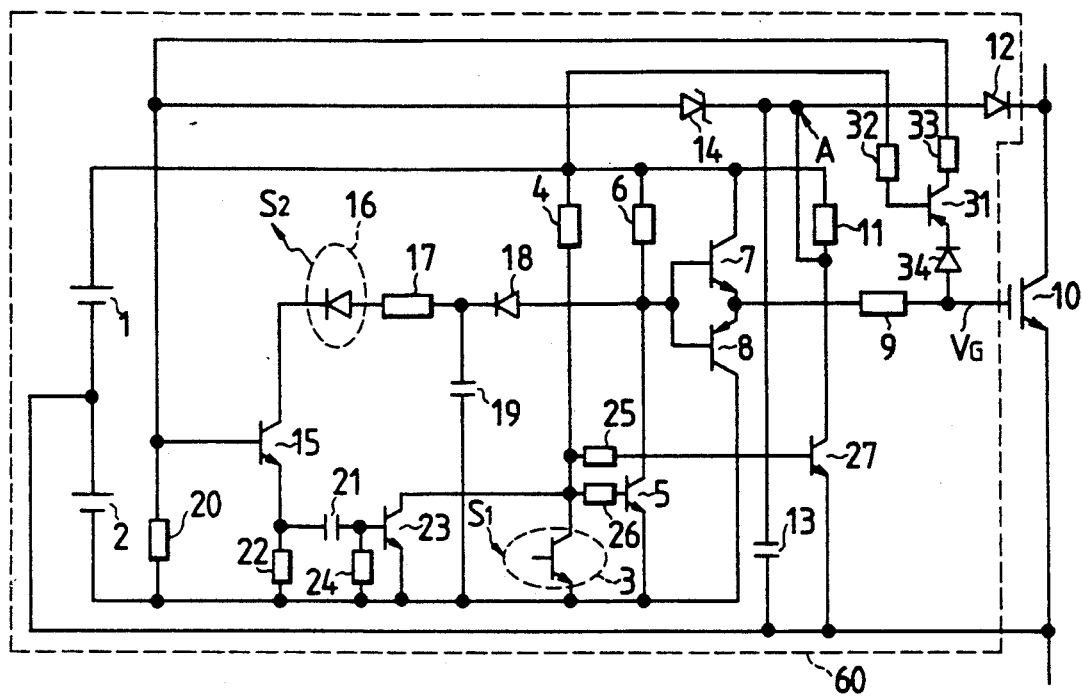
FIG. 12 is a circuit diagram of a seventh preferred embodiment.

FIG. 12 shows the seventh preferred embodiment in which this invention is applied. The different point between FIG. 11 and FIG. 12 is that the connection point of the collector resistor 33 is directly, not through the Zener diode 14, connected to the base of the NPN transistor 15. By this configuration, faster operation of the overcurrent detecting can be realized without masking, delaying, by the condenser 13 and the Zener diode 14. Here, when the PNP transistor 31 is misoperated by accident because of noise, the second overcurrent detecting circuit might be activated.

However, the signal due to the misoperation is bypassed to the collector of the IGBT 10 through the Zener diode 14 and the diode 12 avoiding this problem.

Figure 13:
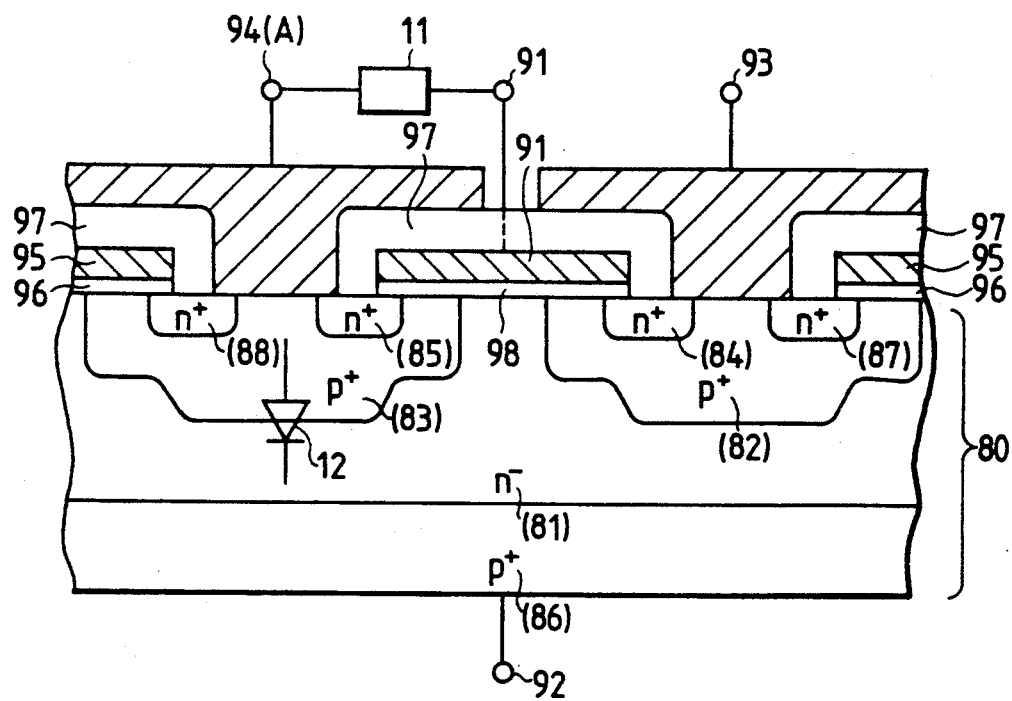
FIG. 13 is a cross section diagram showing one example of IGBT 10 and the diode 12 in the one of the first to the seventh embodiments.
Figure 14:
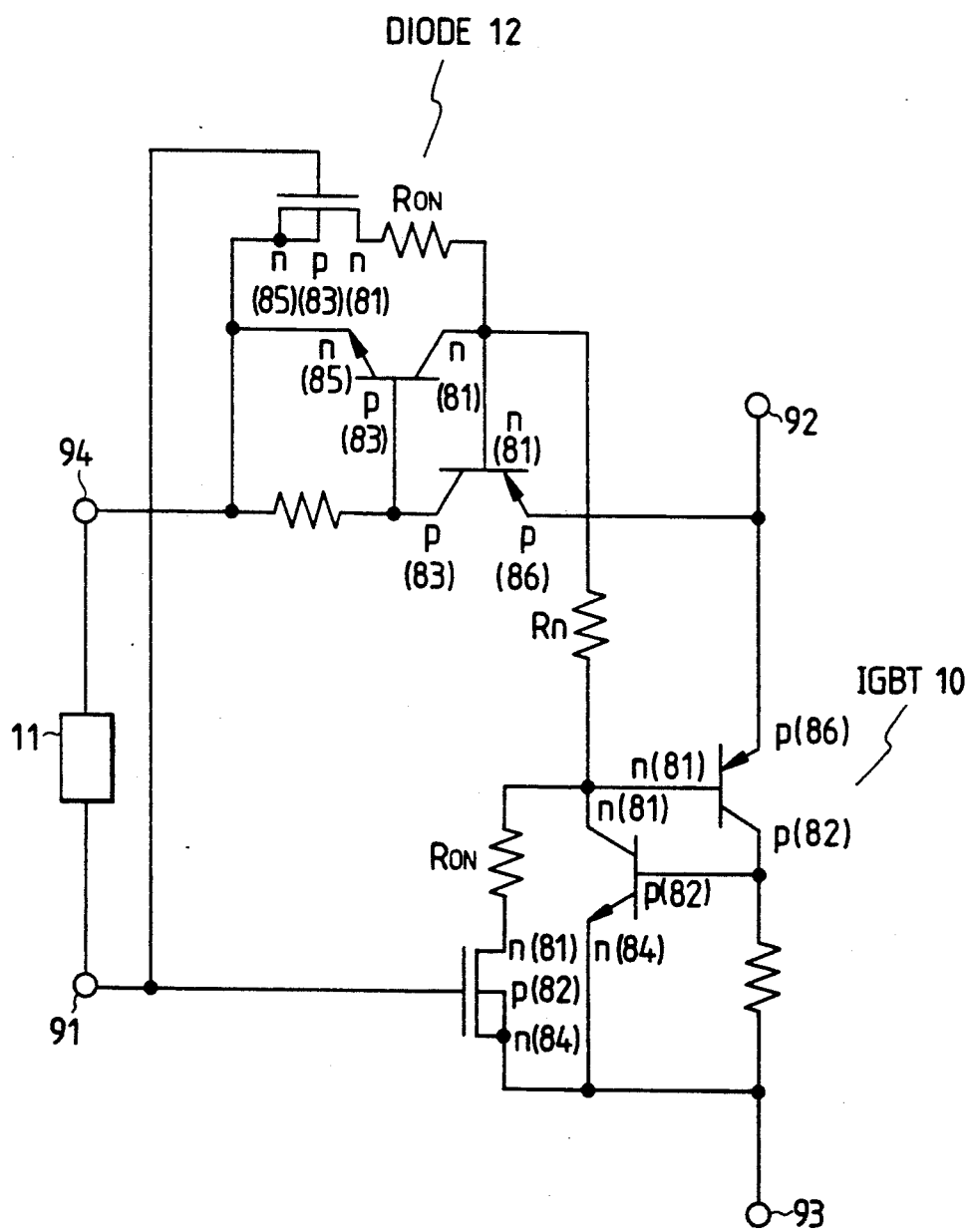
FIG. 14 is a circuit diagram of FIG. 13.

FIG. 13 is a cross section diagram showing one example of IGBT 10 in the one of the first to the seventh embodiments. FIG. 14 is a circuit diagram of FIG. 13.

A semiconductor substrate 80 has a first region 81 of N conductivity type (herein after referred to as n⁻region 81), a second region 82 of P conductivity type (p+region 82), a third region 83 of P conductivity type (p+region 83) separated from p+region 82 by the n-region 81, a fourth region 84 of N conductivity type (n+region 84) separated from n⁻region 81 by p+region 82, a fifth region 85 of N conductivity type (n+region 85) separated from n-region 81 by p+region 83, and a sixth region 86 of P conductivity type (p+region 86) separated from p+region 82 and p+region 83 by n-region 81. The semiconductor substrate 80 has preferably a seventh region 87 of N conductivity type (n+region 87) separated from n-region 81 and n+region 84 by p+ region 82, and an eighth region 88 of N conductivity type (n+region 88) separated from n⁻region 81 and n+region 85 by p+region 83. A gate electrode 91 is connected through an insulator 98 to n⁻region 81, p+regions 82, 83 and n+regions 84, 85 on the main surface of the semiconductor substrate 80. A collector electrode 92 is connected to p+region 86 on the side facing away from n⁻region 81, on the opposite surface of the semiconductor substrate 80. An emitter electrode 93 is connected to the p+region 82 and n+regions 84, 87 on the side facing away from n⁻region 81, on the main surface of the semiconductor substrate 80. An overcurrent detection electrode 94 is connected to p+region 83 and to n+regions 85, 88 on the side facing away from n⁻region 81 on the main surface of the semiconductor substrate 80. The resistor 11 is connected between the gate electrode 91 and the overcurrent detection electrode 94. In one of the second, third, fifth, sixth and seventh embodiments, the resistor 11 is connected between the gate electrode 91 and the overcurrent detection electrode 94 through the resistor 9 and the collector-emitter current path of NPN transistor 7. An insulator 97 insulates between the gate electrode 91 and the emitter electrode 93 and the overcurrent detection electrode 94 preferably.

The PN connection between n-region 81 and p+ region 83 provides the diode 12. Gate electrodes 95 connected in parallel with the gate electrode 91, insulators 96, 97 provide other IGBTs. The overcurrent detection electrode 94 provides the connection node A in FIG. 1.

By providing an overcurrent detection electrode 94 integrated in the semiconductor substrate with IGBT 10 in this way, it is possible to improve the reliability of the drive circuit 60 against noise since the high voltage part is prevented from getting close to the drive circuit 60.

The above embodiments apply to an IGBT. However, this invention can be applied to an insulated gate field effect transistor (Metal Oxide Semiconductor or field effect transistor).

We claim:

1. A drive circuit for an insulated gate transistor having a gate comprising:

a gate voltage input circuit connected to the insulated gate transistor for converting an input signal which identifies an ON or OFF state of the insulated gate transistor to a gate voltage, and for supplying the gate voltage to the gate of the insulated gate transistor;

an overcurrent adjusting circuit connected to the insulated gate transistor for detecting an overcurrent of the insulated gate transistor and for adjusting the overcurrent of the insulated gate transistor to a predetermined value; and an ON holding circuit connected to the gate voltage input circuit and the overcurrent adjusting circuit for outputting a signal which identifies the ON state of the insulated gate transistor to the gate voltage input circuit and for inhibiting the gate voltage input circuit from being responsive to the input signal which identifies the OFF state of the insulated gate transistor when the overcurrent adjusting circuit operates continuously;

wherein the gate voltage input circuit is responsive to a logical OR of an output signal of the ON holding circuit and the input signal.

2. A drive circuit according to claim 1 wherein the overcurrent adjusting circuit comprises;

an overcurrent detecting circuit connected to the insulated gate transistor for detecting the overcurrent of the insulated gate transistor, and an adjusting circuit connected to the overcurrent detecting circuit to be responsive to an output of the overcurrent detecting circuit for adjusting the overcurrent of the insulated gate transistor to the predetermined value.

3. A drive circuit according to claim 1 wherein the insulated gate transistor is an insulated gate bipolar transistor.

4. A drive circuit according to claim 1 wherein the insulated gate transistor is an insulated gate field effect transistor.

5. A drive circuit according to claim 2, wherein the overcurrent detecting circuit detects a main current of the insulated gate transistor and outputs a detection signal when the main current is more than a predetermined value.

6. A drive circuit according to claim 5 wherein the overcurrent detecting circuit detects a collector voltage of the insulated gate transistor and outputs a first detection signal when the collector voltage is more than a first predetermined voltage.

7. A drive circuit according to claim 5 wherein the overcurrent detecting circuit detects the gate voltage of the insulated gate transistor and outputs a second detection signal when the gate voltage is more than a second predetermined voltage.

8. A drive circuit according to claim 5 wherein the overcurrent detecting circuit detects a collector voltage of the insulated gate transistor and the gate voltage, and outputs a detection signal when the collector voltage is more than a first predetermined voltage and the gate voltage is more than a second predetermined voltage.

9. A drive circuit according to claim 2, wherein the adjusting circuit adjusts the gate voltage to a predetermined voltage.

10. A drive circuit according to claim 2, wherein the overcurrent detecting circuit detects a collector voltage of the insulated gate transistor and outputs a detection signal when the collector voltage is more than a first predetermined voltage, and the adjusting circuit adjusts the gate voltage to a second predetermined voltage.

11. A drive circuit according to claim 10, wherein the first predetermined voltage is substantially equal to the second predetermined voltage.

12. A drive circuit according to claim 10, wherein the first predetermined voltage is different from the second predetermined voltage.

13. A drive circuit according to claim 12, wherein the first predetermined voltage is larger than the second predetermined voltage.

14. A drive circuit according to claim 1, wherein the gate voltage input circuit includes a first transistor being responsive to the input signal and having a main current path, and the ON holding circuit includes a second transistor being responsive to an output signal of the overcurrent adjusting circuit and having a main current path connected in parallel with the main current path of the first transistor.

15. A drive circuit according to claim 14, wherein the second transistor is responsive to the output signal of the overcurrent adjusting circuit through a condenser.

16. An overcurrent detecting circuit for an insulated gate transistor having a gate responsive to an input signal comprising:
a transistor having a base connected to a first voltage source with a predetermined value through a first resistor, having a collector connected to a collector of the insulated gate transistor through a second resistor and a first diode, and having an emitter connected to the gate of the insulated gate transistor through a second diode;
wherein a voltage at a connection node between the first diode and the second resistor is output as a first overcurrent detection signal.

17. An overcurrent detecting circuit according to claim 16, wherein the overcurrent detecting circuit further comprises; a third resistor connected between a second voltage source and the collector of the insulated gate transistor through the first diode, and wherein voltage at connection node a (A) between the first diode and the third resistor is output as a second overcurrent detection signal.

18. An overcurrent detecting circuit according to claim 17, wherein the overcurrent detecting circuit further comprises;
a detection delay circuit for outputting the second overcurrent detection signal with a predetermined delay, wherein the predetermined delay is shortened by the first overcurrent detection signal.

19. A drive circuit for an insulated gate transistor having a gate comprising:
a gate voltage input circuit connected to the insulated gate transistor for converting an input signal to a gate voltage, and for supplying the gate voltage to the gate of the insulated gate transistor;
an overcurrent detecting circuit connected to the insulated gate transistor for detecting an overcurrent of the insulated gate transistor; and
an overcurrent adjusting circuit connected to the gate voltage input circuit and the overcurrent detecting circuit for adjusting the overcurrent of the insulated gate transistor to a predetermined value;
wherein said overcurrent detecting circuit comprises:
a transistor having a base connected to a first voltage source with a predetermined value through a first resistor, having a collector connected to a collector of the insulated gate transistor through a second resistor and a first diode, and having an emitter connected to the gate of the insulated gate transistor through a second diode;
wherein a voltage at a connection node between the first diode and the second resistor is output as a first overcurrent detection signal.

20. A switching circuit comprising:
an insulated gate transistor having a gate and having a main current path for switching a main current of a load; and
a drive circuit for the insulated gate transistor, said drive circuit comprising:
a gate voltage input circuit connected to the insulated gate transistor for converting an input signal to a gate voltage, and for supplying the gate voltage to the gate of the insulated gate transistor;
an overcurrent detecting circuit connected to the insulated gate transistor for detecting an overcurrent of the insulated gate transistor; and
an overcurrent adjusting circuit connected to the gate voltage input circuit and the overcurrent detecting circuit for adjusting the overcurrent of the insulated gate transistor to a predetermined value;
wherein said overcurrent detecting circuit comprises:
a transistor having a base connected to a first voltage source with a predetermined value through a first resistor, having a collector connected to a collector of the insulated gate transistor through a second resistor and a first diode, and having an emitter connected to the gate of the insulated gate transistor through a second diode;

wherein a voltage at a connection node between the first diode and the second resistor is output as a first overcurrent detection signal.

21. A current switching apparatus comprising:
a load; and
a switching circuit connected to the load for controlling a main current of the load, said switching circuit comprising:
an insulated gate transistor having a gate and having a main current path for switching the main current of the load; and
a drive circuit for the insulated gate transistor, said drive circuit comprising:
a gate voltage input circuit connected to the insulated gate transistor for converting an input signal to a gate voltage, and for supplying the gate voltage to the gate of the insulated gate transistor;
an overcurrent detecting circuit connected to the insulated gate transistor for detecting an overcurrent of the insulated gate transistor; and
an overcurrent adjusting circuit connected to the gate voltage input circuit and the overcurrent detecting circuit for adjusting the overcurrent of the insulated gate transistor to a predetermined value;
wherein said overcurrent detecting circuit comprises:
a transistor having a base connected to a first voltage source with a predetermined value through a first resistor, having a collector connected to a collector of the insulated gate transistor through a second resistor and a first diode, and having an emitter connected to the gate of the insulated gate transistor through a second diode;
wherein a voltage at a connection node between the first diode and the second resistor is output as a first overcurrent detection signal.

22. An induction motor system comprising:
an induction motor; and
a control circuit connected to the induction motor for controlling a current to operate the induction motor, said control circuit comprising:
an insulated gate transistor having a gate;
a drive circuit connected to the insulated gate transistor for driving the insulated gate transistor; and
a control side circuit connected to the drive circuit for providing an input signal for the drive circuit, the input signal identifying an ON state or an OFF state of the insulated gate transistor;
wherein said drive circuit comprises:
a gate voltage input circuit connected to the insulated gate transistor for converting the input signal identifying the ON state or the OFF state of the insulated gate transistor to a gate voltage, and for supplying the gate voltage to the gate of the insulated gate transistor;

23. An induction motor system according to claim 22, wherein the induction motor has a plurality of phases, and wherein the control circuit comprises a plurality of the insulated gate transistor, a plurality of the drive circuit, and a plurality of the control side circuit connected to the phases of the induction motor so as to control a current in each phase independently.

24. An induction motor system according to claim 23, wherein each of the insulated gate transistors has a main current path and a gate responsive to a respective one of the drive circuits, wherein the main current paths of a plurality of pairs of the insulated gate transistors are connected in series at respective connection nodes, and wherein the connection nodes between the main current paths of the pairs of insulated gate transistors are connected to respective phases of the induction motor.

25. An induction motor system according to claim 24, wherein the main current paths of the pairs of insulated gate transistors are respectively connected in series to a power source.

26. An induction motor system according to claim 22, wherein the control circuit further includes a diode connected in parallel with the main current path of the insulated gate transistor.

27. An induction motor system according to claim 22, wherein the control side circuit comprises a source of the input signal, wherein the source is a pulse width modulation (PWM) signal generator.

* * * * *